(12) United States Patent
Yamazaki et al.

(10) Patent No.: US 9,305,680 B2
(45) Date of Patent: Apr. 5, 2016

(54) TRANSPARENT CONDUCTIVE FILM AND MANUFACTURING METHOD THEREFOR

(75) Inventors: Yuka Yamazaki, Ibaraki (JP); Yoko Muraoka, Ibaraki (JP); Hironobu Machinaga, Ibaraki (JP); Tomotake Nashiki, Ibaraki (JP); Tsukasa Miyazaki, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 13/976,839

(22) PCT Filed: Dec. 16, 2011

(86) PCT No.: PCT/JP2011/079206
§ 371 (c)(1), (2), (4) Date: Jun. 27, 2013

(87) PCT Pub. No.: WO2012/090735
PCT Pub. Date: Jul. 5, 2012

(65) Prior Publication Data
US 2013/0280554 A1    Oct. 24, 2013

(30) Foreign Application Priority Data

Dec. 27, 2010 (JP) ................................. 2010-290499
Mar. 8, 2011 (JP) ................................. 2011-050469

(51) Int. Cl.
*B32B 15/04* (2006.01)
*H01B 5/14* (2006.01)
(Continued)

(52) U.S. Cl.
CPC ................ *H01B 5/14* (2013.01); *C23C 14/024* (2013.01); *C23C 14/086* (2013.01); *C23C 14/5806* (2013.01)

(58) Field of Classification Search
CPC  C23C 14/00; C23C 14/0021; C23C 14/0036; C23C 14/06; C23C 14/08; C23C 14/086; C23C 14/58; C23C 14/5806; C23C 14/22; C23C 14/34; B32B 15/00; B32B 15/04; B32B 15/08; B32B 27/00; B32B 27/06; B32B 33/00; B32B 2250/00; B32B 2250/02; B32B 2250/03; B32B 2255/00; B32B 2255/10; B32B 2255/20; B32B 2255/26; B32B 2307/00; B32B 2307/50; B32B 2307/704
USPC .......... 428/688.689, 697, 701, 702, 332, 699; 204/192.1
See application file for complete search history.

(56) References Cited

U.S. PATENT DOCUMENTS 5,009,922 A * 4/1991 Harano et al. ................. 427/571
6,316,343 B1 * 11/2001 Wada et al. .................... 438/584
(Continued)

FOREIGN PATENT DOCUMENTS

JP      3-15536 B2    3/1991
JP      6-222352 A    8/1994
(Continued)

OTHER PUBLICATIONS

International Search Report dated Mar. 13, 2012, issued in corresponding application No. PCT/JP2011/079206.
Vink, T.J. et al., "On the homogeneity of sputter-deposited ITO films. Part I. Stress and microstructure", Thin Solid Films, vol. 266 No. 2, 1995, p. 145-151.
Notification of Transmittal of Translation of the International Preliminary Report on Patentability (Form PCT/IB/338) of International Application No. PCT/JP2011/079206 mailed Jul. 11, 2013 with Forms PCT/IB/373 and PCT/ISA/237. (9 Pages).
(Continued)

*Primary Examiner* — Lauren Colgan
(74) *Attorney, Agent, or Firm* — Westerman, Hattori, Daniels & Adrian, LLP

(57) ABSTRACT

The present invention relates to a transparent conductive film which is excellent in dotting property under a heavy load and excellent in bending resistance. Provided is a transparent conductive film, comprising a flexible transparent base; and a transparent conductive layer formed on the flexible transparent base and including a crystalline indium/tin composite oxide, wherein a compressive residual stress of the transparent conductive layer is 0.4 to 2 GPa.

5 Claims, 7 Drawing Sheets

(51) Int. Cl.
  *C23C 14/02* (2006.01)
  *C23C 14/08* (2006.01)
  *C23C 14/58* (2006.01)

(56) References Cited

U.S. PATENT DOCUMENTS

| | | | |
|---|---|---|---|
| 6,617,056 B1* | 9/2003 | Hara et al. | 428/697 |
| 2001/0019244 A1* | 9/2001 | Yamazaki et al. | 313/506 |
| 2002/0158853 A1 | 10/2002 | Sugawara et al. | |
| 2003/0194551 A1 | 10/2003 | Sasa et al. | |
| 2005/0173706 A1 | 8/2005 | Sasa et al. | |
| 2010/0013784 A1 | 1/2010 | Nashiki et al. | |
| 2010/0136276 A1 | 6/2010 | Andou et al. | |
| 2011/0177314 A1* | 7/2011 | Tatami et al. | 428/220 |
| 2013/0105301 A1 | 5/2013 | Yamazaki et al. | |
| 2013/0149555 A1 | 6/2013 | Yamazaki et al. | |

FOREIGN PATENT DOCUMENTS

| | | |
|---|---|---|
| JP | 2002-326301 A | 11/2002 |
| JP | 2003-297150 A | 10/2003 |
| JP | 2006-286308 A | 10/2006 |
| JP | 2007-133839 A | 5/2007 |
| JP | 2007-234397 A | 9/2007 |
| JP | 2008-103208 A | 5/2008 |
| JP | 2008-251529 A | 10/2008 |
| TW | 201009854 A | 3/2010 |
| WO | 2010/035598 A1 | 4/2010 |
| WO | 2012/005300 A1 | 1/2012 |

OTHER PUBLICATIONS

Office Action dated Oct. 30, 2013, issued in Taiwanese application No. 100149008, w/ English translation.

Japanese Submission of Information dated Jun. 10, 2014, issued in corresponding Japanese Patent Application No. 2011-050469 with English translation (19 pages).

Chinese Office Action dated Aug. 26, 2014, issued in corresponding CN application No. 201180063189.3 with English translation (14 pages).

Korean Office Action dated Oct. 7, 2014, issued in corresponding KR application No. 10-2013-7013909 with English translation (10 pages).

Notice of Final Rejection dated Apr. 1, 2015, issued in corresponding Korean Patent Application No. 10-2013-7013909, (6 pages).

Office Action dated May 5, 2015, issued in corresponding Chinese Application No. 201180063189.3 (22 Pages).

Office Action Decision of Refusal dated Mar. 17, 2015, issued in corresponding Japanese Patent Application No. 2011-050469 (8 pages).

Office Action dated Feb. 2, 2015, issued in corresponding Chinese Application No. 201180063189.3, w/English translation. (14 pages).

Office Action dated Aug. 11, 2015, issued in counterpart Taiwanese Patent Application No. 103136899, w/English translation (6 pages).

Office Action dated Aug. 26, 2015, issued in counterpart Chinese Patent Application No. 201180063189.3, w/English translation (11 pages).

* cited by examiner

TRANSPARENT CONDUCTIVE FILM AND MANUFACTURING METHOD THEREFOR

TECHNICAL FIELD

The present invention relates to a transparent conductive film in which a crystalline ITO film is formed as a transparent conductive layer on a flexible transparent base. The transparent conductive film of the present invention is suitably used particularly for transparent electrode in a touch panel or the like.

BACKGROUND ART

A so-called electroconductive glass in which an indium oxide thin film is formed on a glass as a transparent electroconductive thin film has been so far well known, but the electroconductive glass, the base of which is glass, is poor in flexibility and processability, and may be undesirable in some applications. Thus, in recent years, transparent conductive films having various kinds of plastic films as bases, including polyethylene terephthalate films, have been favorably used because of the advantages of being excellent in impact resistance in addition to flexibility and processability and being lightweight.

When a transparent conductive layer such as an ITO film is formed on a plastic film base, sputter deposition cannot be performed at a high temperature because of the limitation by the heat resistance of the base. Thus, ITO immediately after film formation forms an amorphous film (which may be partially crystallized). Such an amorphous ITO film has the problems that it is highly yellowish and poor in transparency, a change in resistance after a humidification heat test is large, and so on.

Thus, generally, an amorphous ITO film is converted into a crystalline ITO film by heating under an oxygen atmosphere in the air after the amorphous ITO film is formed on a film base formed of a polymer molded product (see, for example, Patent Document 1). This method provides the advantages that the transparency of the ITO film is improved, and a change in resistance after the humidification heat test is small, so that humidification heat reliability is improved.

On the other hand, a transparent conductive film using a film base has such a problem that a transparent conductive layer is poor in scratch resistance, and is therefore scratched during use to increase the electric resistance or cause breaking. In particular, in a transparent conductive film for a touch panel, a pair of thin films made to face each other with a spacer interposed therebetween are strongly abutted against each other by press dotting from the panel plate side of one of the thin films, and therefore satisfactory endurance property, i.e. dotting property, capable of being resistant thereto is desired. However, a transparent conductive film using a film base is generally inferior in dotting property to an electroconductive glass, and therefore has the problem that the lifetime is decreased as a touch panel.

In view of the aforementioned problem, a transparent conductive film formed by providing a film base having a specific thickness, forming on one surface thereof a transparent dielectric thin film having an optical refractive index smaller than the optical refractive index of the film base, and further forming thereon a transparent conductive layer in this order, and bonding another transparent substrate to the other surface of the film base with a pressure-sensitive adhesive layer interposed therebetween has been proposed (Patent Document 2). According to such a transparent conductive film, the transparency and the scratch resistance of the transparent conductive layer can be improved, and the dotting property as intended for use in a touch panel are improved. Dotting property, when a touch panel is used in a bent state, are improved by forming a transparent conductive layer on one surface of a transparent film base with a plurality of dielectric thin films interposed therebetween (Patent Document 3).

On the other hand, a touch panel of a game machine is often hard hit as compared to other applications, and therefore a transparent conductive film for use therein is required to retain dotting property under a heavier load. Further, dotting property and sliding durability at the screen edge are required as the frame of the touch panel is narrowed, but in input operations at the screen edge, the transparent conductive film is more sharply bent as compared to input operations at the central part of the screen. Therefore, the transparent conductive film is required to retain a higher bending resistance in addition to dotting property under a heavy load.

PRIOR ART DOCUMENTS

Patent Documents

Patent Document 1: JP-B-03-15536
Patent Document 2: JP-A-06-222352
Patent Document 3: JP-A-2002-326301

SUMMARY OF THE INVENTION

Problems to be Solved by the Invention

In view of the situations described above, it is an object of the present invention to provide a transparent conductive film which is excellent in dotting property under a heavy load and excellent in bending resistance.

Means for Solving the Problems

The present inventors have conducted vigorous studies, and resultantly found that dotting property and bending resistance are improved when a transparent conductive layer has a predetermined compressive residual stress, thus leading to completion of the present invention.

The present invention relates to a transparent conductive film having a transparent conductive layer formed on a flexible transparent base and including a crystalline indium/tin composite oxide (crystalline ITO). The compressive residual stress of the crystalline ITO film is preferably 0.4 to 2 GPa. The transparent conductive layer is preferably crystallized by heating. In the crystalline ITO film, a dimensional change relative to an amorphous ITO film before crystallization is preferably −0.3% to −1.5% in at least one direction in the plane.

Further, the present invention relates to a method for manufacturing the transparent conductive film. The manufacturing method of the present invention includes a base providing step of providing a flexible transparent base; a film formation step of forming an amorphous transparent conductive layer including an amorphous indium/tin composite oxide on the flexible transparent base; and a heat treatment step of heating the amorphous transparent conductive layer to be converted into a crystalline indium/tin composite oxide (crystalline ITO film). In the heat treatment step, a compressive stress is given to the transparent conductive layer in at least one direction in the plane.

It is preferred that in the heat treatment step, the transparent conductive layer is compressed so that a dimensional change in at least one direction in the plane is −0.3% to −1.5%. It is also preferred that the crystalline transparent conductive layer has a compressive residual stress of 0.4 to 2 GPa by giving a compressive stress in the heat treatment step.

In the heat treatment step, the heating temperature is preferably 150° C. to 210° C., and the heating time is preferably 150 minutes or less.

Effects of the Invention

In the transparent conductive film of the present invention, a crystalline ITO film having a predetermined compressive residual stress is formed on a flexible transparent base. The crystalline ITO film having a compressive residual stress is excellent in dotting property under a heavy load, and also has a high bending resistance. Therefore, the transparent conductive film of the present invention is suitably used for a touch panel, and is particularly suitably used for a game machine which is required to retain dotting property under a heavy load, and a touch panel of a flexible display which is required to have a high bending resistance.

MODE FOR CARRYING OUT THE INVENTION

Figure 1:
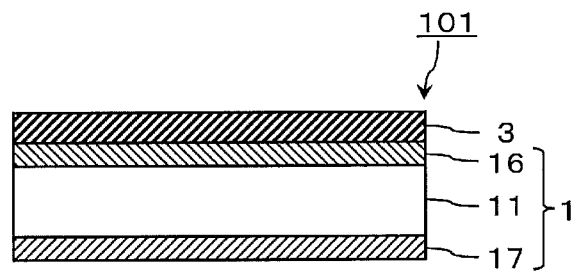
FIG. 1 is a schematic sectional view of a laminate configuration of a transparent conductive film according to one embodiment.

The configuration of a transparent conductive film according to the present invention will be described with reference to the drawings. FIG. 1 is a sectional view schematically showing a transparent conductive film 101 according to a first embodiment of the present invention. The transparent conductive film 101 has a configuration in which a crystalline indium/tin composite oxide (ITO) film 3 is formed on a flexible transparent base 1 including one transparent substrate film 11. The flexible transparent base 1 may be composed of only the transparent substrate film 11, or as shown in FIG. 1, an undercoat layer 16 may be formed on the surface of the transparent substrate film 11 on which an ITO film is formed, or a back surface coating layer 17 may be formed on the opposite surface. FIG. 1 shows a configuration in which one undercoat layer 16 and one back surface coating layer 17 are formed, but these layers may be each composed of two or more layers.

Figure 2:
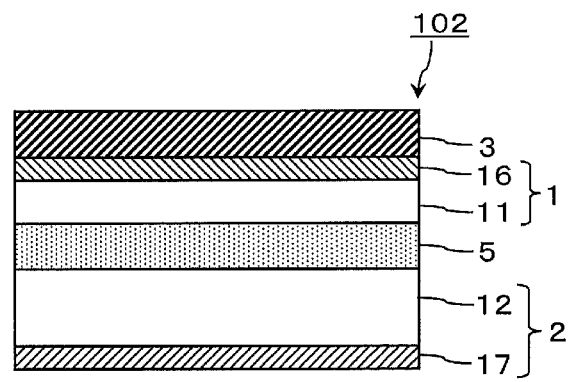
FIG. 2 is a schematic sectional view of a laminate configuration of a transparent conductive film according to one embodiment.

FIG. 2 is a sectional view schematically showing a transparent conductive film 102 according to a second embodiment of the present invention. The transparent conductive film 102 has a configuration in which two or more flexible transparent bases are present, and a crystalline indium/tin composite oxide (ITO) film 3 is formed on a first flexible transparent base 1. Flexible transparent bases 1 and 2 are preferably bonded with an appropriate pressure-sensitive adhesive layer 5 interposed therebetween. FIG. 2 shows a configuration in which two flexible transparent bases 1 and 2 are present, but three or more flexible transparent bases may be laminated. Flexible transparent bases 1 and 2 may include only transparent substrate films 11 and 12, respectively. As shown in FIG. 2, a configuration in which an undercoat layer 16 is formed on the surface of the first transparent substrate film 11 on which the ITO film is formed, the first transparent substrate film forming the first flexible transparent base 1, or a configuration in which a back surface coating layer 17 is formed on the surface opposite to the surface of the second transparent substrate film 12 which is bonded to the first flexible transparent base 1, the second transparent substrate film 12 forming the second flexible transparent base 2, can also be suitably employed. FIG. 2 shows a configuration in which one undercoat layer 16 and one back surface coating layer 17 are formed, but these layers may be each composed of two or more layers. Coating layers other than those shown may be present.

Configurations and manufacturing methods of the transparent conductive film will be described below principally for the first embodiment, but descriptions of the configurations and manufacturing methods are incorporated without change for the second embodiment.

<Flexible Transparent Base>
(Transparent Substrate Film)

The material of the transparent substrate film 11 forming the flexible transparent base 1 is not particularly limited as long as it has flexibility and transparency, and any appropriate material can be used. Specific examples include a polyester-based resin, an acetate-based resin, a polyether sulfone-based resin, a polycarbonate-based resin, a polyamide-based resin, a polyimide-based resin, a polyolefin-based resin, an acryl-based resin, a polyvinyl chloride-based resin, a polystyrene-based resin, a polyvinyl alcohol-based resin, a polyarylate-based resin, a polyphenylene sulfide-based resin, a polyvinylidene chloride-based resin and a (meth)acryl-based resin. Among them especially preferable are a polyester-based resin, a polycarbonate-based resin and a polyolefin-based resin.

The thickness of the transparent substrate film 11 is preferably about 2 to 300 μm, more preferably 6 to 200 μm. If the thickness of the film is extremely small, the mechanical strength may be insufficient, thus making it difficult to perform an operation of forming on the film the undercoat layer 16 and the transparent conductive layer (ITO film) 3. In contrast, if the thickness of the film is extremely large, the scratch resistance of the transparent conductive layer and the dotting property as intended for use in a touch panel may not be improved.

(Undercoat Layer)

On the surface of the transparent substrate film 11 on which the ITO film 3 is formed, the undercoat layer 16 may be provided for the purpose of improving the adhesion of the flexible transparent base 1 with the ITO film 3, controlling reflection characteristics, and so on. The undercoat layer may be composed of one layer, or two or more layers. The undercoat layer is formed of an inorganic substance, an organic substance or a mixture of an inorganic substance and an organic substance. As a material that forms the undercoat layer, for example, $SiO_2$, $MgF_2$, $Al_2O_3$ or the like is preferably used as an inorganic substance. Examples of the organic substance include organic substances such as an acryl resin, a urethane resin, a melamine resin, an alkyd resin and a siloxane-based polymer. As the organic substance, in particular, it is preferred to use a thermosetting resin formed of a mixture of a melamine resin, an alkyd resin and an organic silane condensate. The undercoat layer can be formed by a vacuum deposition method, a sputtering method, an ion plating method or a coating method using the above-mentioned material.

When the ITO film is formed, the surface of the flexible transparent base 1 can be subjected to an appropriate treatment for tackiness such as a corona discharge treatment, an ultraviolet ray irradiation treatment, a plasma treatment or a sputter-etching treatment beforehand to improve adhesion with the ITO film.

(Back Surface Coating Layer)

On the surface of the transparent substrate film 11 opposite to the surface on which the ITO film 3 is formed, for example an anti-glare treatment layer or anti-reflection treatment layer intended for improvement of visibility or a hard coating layer intended for protection of an outer surface may be provided as the back surface coating layer 17. For the hard coat layer, a cured film formed of a curable resin such as a melamine-based resin, a urethane-based resin, an alkyd-based resin, an acryl-based resin or a silicone-based resin is preferably used. The back surface coating layer 17 may be provided on the transparent substrate film 11 before the transparent conductive layer 3 is formed, or after the transparent conductive layer 3 is formed.

The flexible transparent base before the ITO film is formed thereon preferably has heat shrinkability in at least one direction. As described later, the crystalline ITO film can be formed by subjecting an amorphous ITO film to a heating treatment, and when the base has heat shrinkability, the base is shrunk during the heating treatment to thereby give a compressive stress to the ITO film, so that a crystalline ITO film having a desired compressive residual stress can be easily formed.

The dimensional change rate (thermal shrinkage coefficient) of the flexible transparent base 1 when heated is preferably set so that a predetermined compressive stress is given when the ITO film is crystallized. Thus, the preferred range of the thermal shrinkage coefficient varies depending on heating conditions (temperature and time) during crystallization of the ITO film, but the base before formation of the ITO film has, for example, a dimensional change rate of preferably about −2% to +1%, more preferably about −1.5% to 0% when heated at 150° C. for 1 hour in accordance with JIS K7133 (1995). For example, by using as the transparent substrate film 11a stretched film which is streched in at least one direction, the flexible transparent base 1 can be made to have such heat shrinkability as described above. The heating shrinkage amount can be controlled to fall within a predetermined range by the draw ratio of the film or the like.

When the dimensional change rate (thermal shrinkage coefficient) of the flexible transparent base varies depending on the direction, it is preferred that the dimensional change rate in any one direction falls within the aforementioned range. Even when the base has no heat shrinkability, or the dimensional change rate of the base falls out of the aforementioned range, the shrinkage amount can be controlled by adjusting conditions for heating the ITO film to be crystallized. A crystalline ITO film having a desired compressive residual stress can also be formed by giving a shrinkage stress from outside by a method of bonding a heat-shrinkable film aside from the base 1, or the like in heating the ITO film to be crystallized, or by a method of controlling the heat shrinkage amount by giving a tensile force from outside, or the like.

<Transparent Conductive Layer>

The transparent conductive layer 3 has a crystalline ITO as a main component. Hereinafter, the transparent conductive layer may be referred to as a "crystalline ITO film" or simply as an "ITO film". In the present invention, the compressive residual stress of the crystalline ITO film 3 is preferably 0.4 to 2 GPa, more preferably 0.7 to 1.6 GPa, further preferably 0.9 to 1.55 GPa, especially preferably 1.2 to 1.4 GPa. The phrase "the crystalline ITO film has a compressive residual stress" means that a lattice constant is small as compared to a case where there is no strain. When the compressive residual stress is 0.4 GPa or more, the crystalline ITO film is excellent in dotting property under a heavy load and bending resistance. On the other hand, the compressive residual stress is preferably 2 GPa or less from the viewpoint of inhibition of failures such as peeling of the ITO film or occurrence of curl of the transparent conductive film.

If the compressive residual stress of the ITO film is extremely large, the humidification heat reliability of the transparent conductive film may be not sufficient because a change in resistance due to humidification heat is increased. Thus, from the viewpoint of obtaining a transparent conductive film having a higher reliability, the compressive residual stress of the crystalline ITO film is preferably 1.6 GPa or less, more preferably 1.55 GPa or less, further preferably 1.4 GPa or less. As a reason why the change in resistance due to humidification heat is increased when the compressive residual stress of the ITO film is large, it is considered that an ITO film having a large compressive residual stress is susceptible to occurrence of strains and cracks at crystal grain boundaries. That is, it is thought that when the transparent conductive film is exposed to a high-temperature and a high-humidity environment, the transparent substrate film is expanded by absorption of moisture, and therefore the ITO film formed thereon is given a tensile stress, so that the film is collapsed with strains or cracks at crystal grain boundaries as a starting point, leading to an increase in resistance.

As will be described in detail in Examples later, the compressive residual stress $\sigma$ of the crystalline ITO film can be calculated on the basis of a lattice strain $\in$ determined from a diffraction peak of the (622) plane at around $2\theta=60°$ in powder X-ray diffraction, and an elastic modulus (Young's modulus) E and a Poisson's ratio $\nu$.

The crystalline ITO film is obtained by a method of sputter-depositing an ITO on a base at a high temperature of, for example, 200° C. or higher, or the like, but when the heat resistance of the base or the like is considered, it is preferred that an amorphous ITO film is once formed on a basis, and thereafter the amorphous ITO film is heated together with the base to be crystallized, thereby forming a crystalline ITO film.

(Formation of Amorphous ITO Film)

The amorphous ITO film is formed by a gas phase method. Examples of the gas phase method include an electron beam deposition method, a sputtering method and an ion plating method, but the sputtering method is preferable because a uniform thin film is obtained, and a DC magnetron sputtering method may be suitably employed. It is to be noted that the "amorphous ITO" is not limited to a completely amorphous ITO, but may contain a small amount of crystalline components. Whether ITO is amorphous or not can be determined by immersing a laminated body, in which an ITO film is formed on a base, in hydrochloric acid having a concentration of 5% by weight for 15 minutes, then rinsing with water and drying the laminated body, and measuring a resistance between terminals at an interval of 15 mm using a tester. Since the amorphous ITO film is etched with hydrochloric acid to vanish, the resistance is increased due to immersing in hydrochloric acid. In this specification, the ITO film is considered to be amorphous when the resistance between terminals at an interval of 15 mm exceeds 10 kΩ after immersing in hydrochloric acid, rinsing with water, and drying.

An amorphous ITO film $3a$ formed on the base is preferably crystallized by short-time heating. Specifically, it is preferred that crystallization can be completed within 60 minutes or less, more preferably within 30 minutes or less, further preferably within 20 minutes or less when heated at 150° C. When ITO can be crystallized in this time scale, crystallization of ITO proceeds in conformity with heat shrinkage of the base, and therefore a compressive stress is given at crystallization, so that a crystalline ITO film having a compressive residual stress can be easily formed. Whether crystallization of the ITO film is completed or not can be determined by immersing the film in hydrochloric acid and performing rinsing with water and drying, and measuring a resistance between terminals at an interval of 15 mm as in the determination for the amorphous ITO described above. When the resistance between terminals is 10 kΩ or less, it is determined that the ITO film is converted into a crystalline ITO.

The temperature and time required for fully crystallizing the amorphous ITO film can be adjusted by adjusting, for example, the type of a target used for sputtering, the ultimate degree of vacuum during sputtering, the flow rate of an introduced gas, the film formation temperature (substrate temperature) and so on.

As a sputtering target, a metal target (In—Sn target) or a metal oxide target ($In_2O_3$—$SnO_2$ target) is suitably used. When an $In_2O_2$—$SnO_2$ metal oxide target is used, the amount of $SnO_2$ in the metal oxide target is preferably 0.5% by weight to 15% by weight, more preferably 1 to 10% by weight, further preferably 2 to 6% by weight, based on the total weight of $In_2O_2$ and $SnO_2$. In the case of reactive sputtering using an In—Sn metal target, the amount of Sn atoms in the metal target is preferably 0.5% by weight to 15% by weight, more preferably 1 to 10% by weight, further preferably 2 to 6% by weight, based on the total weight of In atoms and Sn atoms. If the amount of Sn or $SnO_2$ in the target is too small, the ITO film may be poor in durability. To the contrary, if the amount of Sn or $SnO_2$ is too large, the time required for crystallization may be increased. That is, in crystallization, apart of Sn, which is not incorporated into $In_2O_3$ crystal lattices, may act like an impurity to thereby hinder crystallization. Thus, it is preferred that the amount of Sn or $SnO_2$ in the target is made to fall within the above-described range.

For sputter deposition using such a target, it is preferred that the interior of a sputtering device is first evacuated to a degree of vacuum (ultimate degree of vacuum) of preferably $1 \times 10^{-3}$ Pa or less, more preferably $1 \times 10^{-4}$ Pa or less to remove, from the atmosphere, impurities such as moisture in the device and organic gases generated from the base. This is because presence of moisture and organic gases terminates a dangling bond occurring during sputter deposition to hinder crystal growth of ITO.

Next, an inert gas such as an Ar gas is introduced into the sputtering device evacuated as described above to carry out sputter deposition. When a metal target (In—Sn target) is used as a sputtering target, an oxygen gas which is a reactive gas is introduced together with an inert gas to carry out sputter deposition. The introduced amount of oxygen based on the inert gas is preferably 0.1% by volume to 15% by volume, more preferably 0.1% by volume to 10% by volume. The pressure during film formation is preferably 0.05 Pa to 1.0 Pa, more preferably 0.1 Pa to 0.7 Pa. If the film formation pressure is too high, the film formation speed may be decreased and conversely, if the pressure is too low, discharge may be destabilized.

During sputter deposition, the substrate temperature is preferably 40° C. to 190° C., more preferably 80° C. to 180° C. If the film formation temperature is too high, an appearance failure due to thermal creasing, or thermal degradation of the base may occur. Conversely, if the film formation temperature is too low, film quality, such as transparency, of the ITO film may be deteriorated.

The thickness of the ITO film can be appropriately adjusted so that the crystallized ITO film has a desired resistance, but for example, the thickness is preferably 10 to 300 nm, more preferably 15 to 100 nm. If the thickness of the ITO film is small, the time required for crystallization may be increased, and if the thickness of ITO is large, quality as a transparent conductive film for a touch panel may be deteriorated such that the specific resistivity after crystallization is too low, or transparency is deteriorated.

(Crystallization of ITO Film by Heating)

The laminated body of the flexible transparent base 1 and the amorphous ITO film $3a$ thus obtained is subjected to a heat treatment, so that the amorphous ITO film is heated to be converted into a crystalline ITO film. It is preferred that a compressive stress is given to the ITO film in the heat treatment step from the viewpoint of obtaining a crystalline ITO film having a compressive residual stress. Specifically, the dimensional change in one direction of the film surface of the ITO film is preferably −0.3% to −1.5%, more preferably −0.55% to −1.2%, further preferably −0.7% to −1.05%, especially preferably −0.7% to −0.9%. It is to be noted that the dimensional change (%) is defined as $100 \times (L_1 - L_0)/L_0$ where a distance $L_0$ between two points in one direction of the ITO film before being subjected to a heat treatment is changed to L after the heat treatment. By ensuring that the dimensional change falls within the aforementioned range, the heat-treated crystalline ITO film can have a predetermined compressive residual stress as described above, and therefore a transparent conductive film excellent in dotting property and bending-resistance can be obtained.

The heating temperature and heating time associated with the heat treatment can be appropriately selected so that the ITO film is fully crystallized. For example, the heating temperature is preferably 150° C. to 210° C., more preferably 160° C. to 200° C., further preferably 170° C. to 190° C. If the heating temperature is too low, crystallization may no longer proceed, or much time may be required for crystallization, leading to poor productivity. If the heating temperature is low, a suitable compressive stress may not be given during crystallization of the ITO film because the heat shrinkage amount of the base is small. On the other hand, if the heating temperature is too high, the base may be degraded, or the humidification heat reliability of the transparent conductive film may be secured, as the residual compressive stress is excessively increased due to rapid heat shrinkage of the base.

The heating time is preferably 150 minutes or less. If the heating time is too long, the base may be degraded, or productivity may be deteriorated. On the other hand, if the heating time is too short, crystallization of ITO may no longer proceed, or an appropriate compressive stress may not be given to the ITO film because of insufficient heat shrinkage of the base. From such a point of view, the heating time is preferably 5 to 60 minutes, more preferably 5 minutes to 30 minutes. When the ITO film is heated to be crystallized in this time scale, a stress resulting from shrinkage of the base is propagated to ITO, so that a crystalline ITO film having a compressive residual stress is easily formed. The heating temperature and heating time described above are one example, and an appropriate heating temperature and heating time can be selected according to characteristics of the amorphous ITO film.

For giving a compressive stress to the ITO film, a method utilizing heat shrinkage of the flexible transparent base is suitably employed. A laminated body in which the amorphous ITO film 3a before crystallization is formed on the flexible transparent base 1 has a dimensional change rate of preferably about −2% to +1%, more preferably about −1.5% to 0%, further preferably about −1.2% to −0.3% when heated at 150° C. for 1 hour, from the viewpoint of ensuring that the dimensional change rate falls within the aforementioned preferred range when the ITO film is heated to be crystallized. Since generally the thickness of the amorphous ITO film is much smaller than the thickness of the flexible transparent base, the dimensional change rate of the laminated body of the amorphous ITO film and the flexible transparent base is substantially equal to the dimensional change rate of the flexible transparent base.

A compressive stress can also be given to the ITO film by giving a shrinkage stress from outside, besides a heat shrinkage force of the base described above, by, for example, a method of bonding a heat shrinkable film onto the ITO film surface or the base, aside from the base 1, at the time of heating the ITO film to be crystallized. The shrinkage amount can also be controlled by using a base having a large shrinkage amount (dimensional change rate is negative and absolute value is large) and giving a tensile force from outside.

When the dimensional change rate (thermal shrinkage coefficient) of the flexible transparent base varies depending on the direction, it is preferred that the dimensional change rate in any one direction falls within the aforementioned range. Even when the base has no heat shrinkability, or the dimensional change rate falls out of the aforementioned range, the shrinkage amount can be controlled by adjusting conditions for heating the ITO film to be crystallized.

It is preferred that heating conditions during the heat treatment are selected not only for the purpose of crystallizing ITO, but also for heat-shrinkage of the base in conformity with the time scale of crystallization of ITO. That is, as crystallization of ITO proceeds or when the base is heat-shrunk after crystallization of ITO, a compressive stress is given to the crystalline ITO film, so that a crystalline ITO film having a compressive residual stress is obtained.

These heating conditions vary depending on the heat deformation profile of the base, but such heating conditions that the base is heat-shrunk in conformity with the time scale of crystallization of ITO can be selected by confirming the heat deformation profile of the base, or the base after formation of the amorphous ITO film beforehand by thermal analysis such as, for example, TMA. Examples of schematically analyzing a relationship between crystallization of ITO and heat deformation of the base using TMA are shown in FIGS. 7 and 8.

Figure 7:
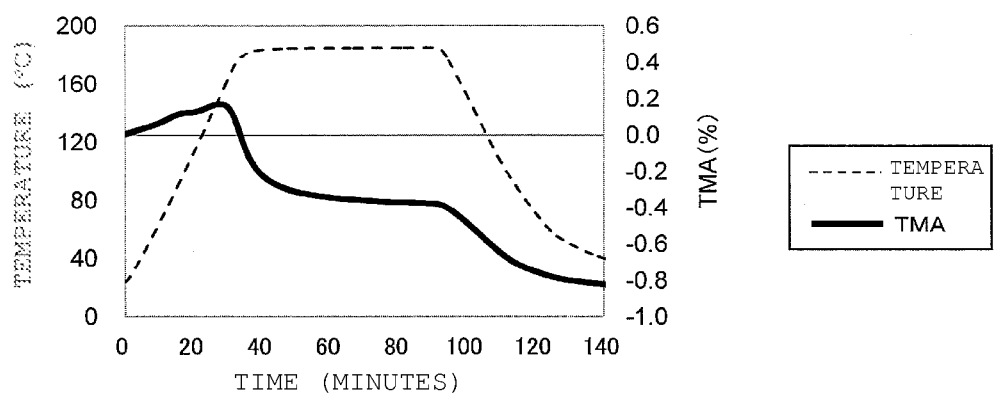
FIG. 7 is a view showing results of measuring a dimensional change behavior of a transparent conductive film by TMA.
Figure 8:
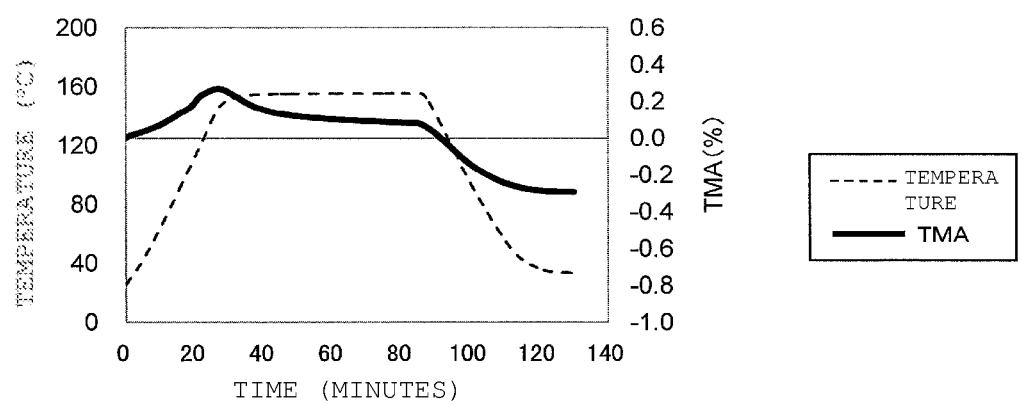
FIG. 8 is a view showing results of measuring a dimensional change behavior of a transparent conductive film by TMA.

FIGS. 7 and 8 show results of analyzing by TMA the dimensional change behavior at the time of heating of a transparent conductive film in which an amorphous ITO film having a thickness of 20 nm is formed on one surface of a PET film having a thickness of 25 μm and a PET film having a total thickness of 130 μm (thickness of hard coat layer: 5 μm) is laminated on the other surface with a pressure-sensitive adhesive layer having a thickness of 25 μm interposed therebetween. The abscissa represents a time, and the ordinate represents a temperature and a dimensional change rate. Measurement conditions include a sample width of 4 mm, a load of 20 mN/4 mm, an initial length of 10 mm, a temperature-elevation and temperature-fall rate of 5° C./minute and a retention time of 60 minutes, and FIGS. 7 and 8 show results of measurement at retention temperatures of 190° C. and 150° C., respectively.

Progress of crystallization over time when heating was performed in the same temperature profile as in each of FIGS. 7 and 8 was analyzed with a diffraction peak intension of the (222) plane in an X-ray diffraction method to find that for the retention temperature of 190° C. (corresponding to FIG. 7), crystallization started to proceed at a temperature of about 120° C., and crystallization had been almost completed at the time when the temperature reached 180° C. On the other hand, it was found that for the retention temperature of 150° C. (corresponding to FIG. 8), crystallization had been almost completed about 30 minutes after the temperature reached 150° C.

In FIG. 7, first stage large shrinkage (dimensional change in the negative direction) occurs during a period between the time point at which crystallization starts to proceed and the time point at which crystallization has been completed (30 minutes to 40 minutes after the start of temperature elevation), second stage shrinkage occurs at the time of temperature fall (after completion of crystallization), and it is presumed that a compressive stress is given to the ITO film at these shrinkages. In FIG. 8, on the other hand, shrinkage occurs at the time of proceed of crystallization and at the time of temperature fall, but it is apparent that the amount of first-stage shrinkage is small as compared to FIG. 7. Meanwhile, when Example 2 and Example 6 described later are compared, the residual compressive stress of the ITO film is 1.50 GPa in Example 2 in which crystallization is performed at 190° C., whereas the residual compressive stress of the ITO film is 0.57 GPa in Example 6 in which crystallization is performed at 150° C. Accordingly, schematic analysis using TMA is considered to reflect the tendency of a dimensional change behavior when the ITO film is actually crystallized, and such heating conditions that the base is shrunk in conformity with the time scale of crystallization of ITO can be selected on the basis of results of analysis by TMA.

In the present invention, as described above, a compressive stress is given to the ITO film at the time of film formation and crystallization, thereby obtaining a transparent conductive film excellent in durability. Further, it is preferred that crystals of the ITO film have a predetermined grain size distribution from the viewpoint of obtaining a transparent conductive film which is further excellent in inhibition of occurrence of cracks at the time of bending, dotting property under a heavy load, and pen sliding durability. That is, in the ITO film surface, it is preferred that the content of crystals having a maximum grain size of 300 nm or less is 95% by area or more, and it is more preferred that crystals having a maximum grain size of more than 300 nm are not present. The content of crystals having a maximum grain size of 200 nm or less is preferably more than 50% by area. In particular, it is preferred that the content of crystals having a maximum grain size of 100 nm or less is more than 5% by area, and the maximum grain size of remaining crystals falls within a distribution range of more than 100 nm and 200 nm or less, and it is especially preferred that the content of crystals having a grain size of 100 nm or less is 10% by area or more.

If the crystal grain size of the ITO film is too small, apart in an amorphous-like state may exist in the film, leading to deterioration of reliability and pen durability, and therefore it is desirable to ensure that the crystal grain size is not extremely small. From such a viewpoint, the maximum grain size of crystals is preferably 10 nm or more, further preferably 30 nm or more.

The maximum grain size and distribution of crystals are determined by observing a surface of an electroconductive thin film with a field-emission transmission electron microscope (FE-TEM). The maximum grain size of crystals is the largest diagonal or diameter in each polygonal or oblong region observed. The content of crystals having the aforementioned maximum grain size is specifically an area ratio of crystals of each grain size per unit area (1.5 μm×1.5 μm) in the electron microscope image.

For controlling the crystal grain size and grain size distribution of the ITO film as described above, the material constitution of an electroconductive thin film and the method for formation of the thin film may be appropriately selected. For example, by increasing the content of $SnO_2$ in ITO, the content ratio of crystals having a small grain size can be increased. The content of $SnO_2$ in ITO (content of $SnO_2$ based on the total weight of $In_2O_3$ and $SnO_2$) is preferably 2% by weight or more, more preferably 3% by weight or more. The crystal grain size of the ITO film after crystallization can also be decreased by providing a film of an inorganic substance formed by a vacuum deposition method, particularly preferably a $SiO_2$ thin film formed by a vacuum deposition method, as an anchor layer that serves as a ground layer in formation of an ITO film, i.e. an anchor layer that is closest to the ITO film. In addition, by decreasing the ultimate degree of vacuum (making the pressure closer to vacuum) during formation of the ITO film, or increasing the substrate temperature during film formation, the crystal grain size may be decreased.

Second Embodiment

Next, a transparent conductive film 102 according to a second embodiment of the present invention, which includes two or more flexible transparent bases, will be described principally for matters different from those of the first embodiment.

The transparent conductive film 102 according to the second embodiment includes two or more flexible transparent bases. A first flexible transparent base 1 is a base for forming an ITO film, and an undercoat layer 16 or the like is formed on a first transparent substrate film 11 as necessary. A second flexible transparent base is bonded to the first flexible transparent base with appropriate bonding means such as a pressure-sensitive adhesive layer 5 interposed therebetween. The second flexible transparent base has a back surface coating layer 17 or the like formed on a second transparent substrate film 12 as necessary. As the transparent substrate films 11 and 12, transparent substrate films similar to those described above for the first embodiment are suitably used. FIG. 2 shows a configuration in which two flexible transparent bases are present, but a configuration in which three or more flexible transparent bases are present can also be employed.

In the second embodiment, a crystalline ITO film preferably has a compressive residual stress similar to that described above for the first embodiment. It is preferred that such a crystalline ITO film is formed by forming an amorphous ITO film once, and then heating the amorphous ITO film together with the base to be crystallized, as described above for the first embodiment.

<Pressure-Sensitive Adhesive Layer>

It is preferred that a plurality of transparent substrate films 11 and 12 are bonded with the pressure-sensitive adhesive layer 5 interposed therebetween. As a constituent material of the pressure-sensitive adhesive layer 5, any material can be used without particular limitation as long as it has transparency. For example, one having as a base polymer a polymer such as an acryl-based polymer, a silicone-base polymer, a polyester, a polyurethane, a polyamide, a polyvinyl ether, a vinyl acetate/vinyl chloride copolymer, a modified polyolefin, an epoxy-based polymer, a fluorine-based polymer, or a rubber-based polymer such as natural rubber or synthetic rubber can be appropriately selected and used. In particular, an acryl-based pressure-sensitive adhesive is preferably used in terms of being excellent in optical transparency, showing adhesive propertied such as moderate wettability, cohesiveness and tackiness, and also being excellent in weather resistance, heat resistance and the like.

The pressure-sensitive adhesive layer 5 can have a function of, for example, improving the scratch resistance of the transparent conductive layer 3 provided on the transparent substrate film 11, and dotting property as intended for use in a touch panel, owing to its cushion effect. From the viewpoint of exhibiting this function more effectively, it is preferred that the elastic modulus of the pressure-sensitive adhesive layer 5 is set to 1 to 100 $N/cm^2$ and the thickness thereof is set to 1 μm or more (more preferably 5 to 100%). When the above-mentioned range is satisfied, the effect described above is sufficiently exhibited, and adhesion strength between transparent substrates is sufficient.

<Manufacturing Process of Transparent Conductive Film>

Figure 3A:
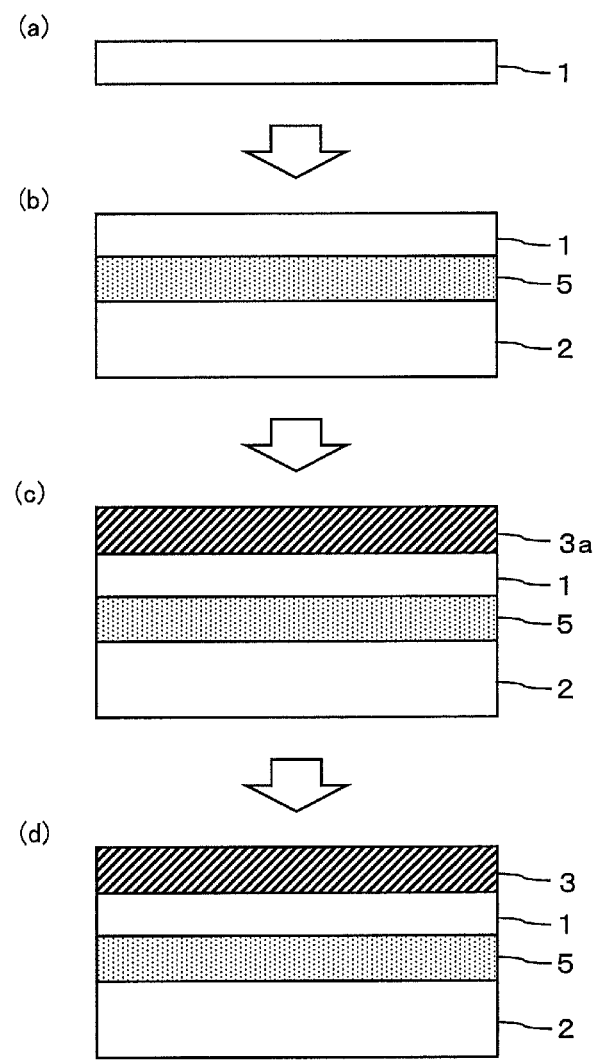
FIG. 3A is a schematic sectional view conceptually showing one example of a manufacturing process of a transparent conductive film.
Figure 3B:
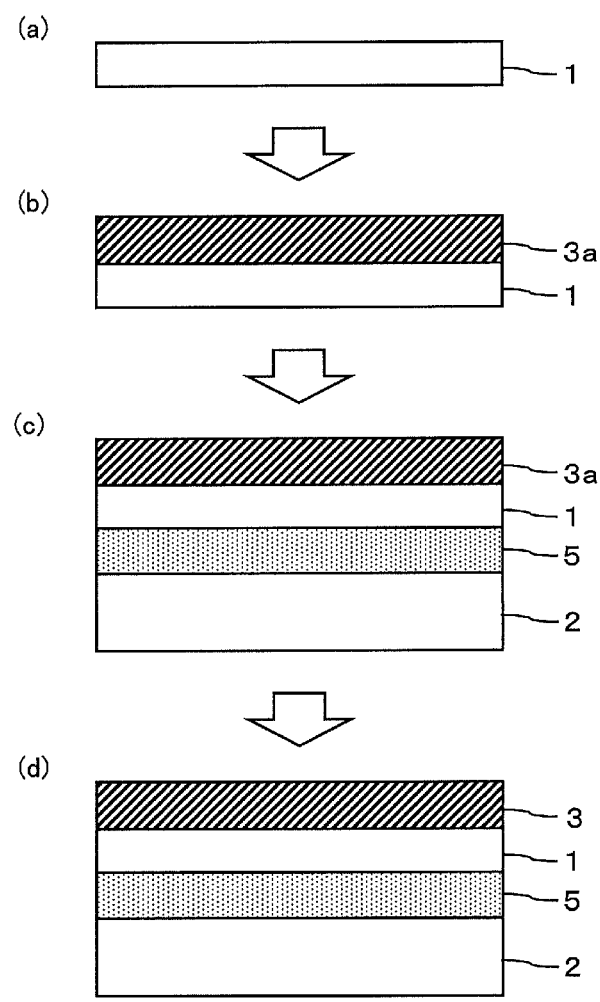
FIG. 3B is a schematic sectional view conceptually showing one example of a manufacturing process of a transparent conductive film.
Figure 3C:
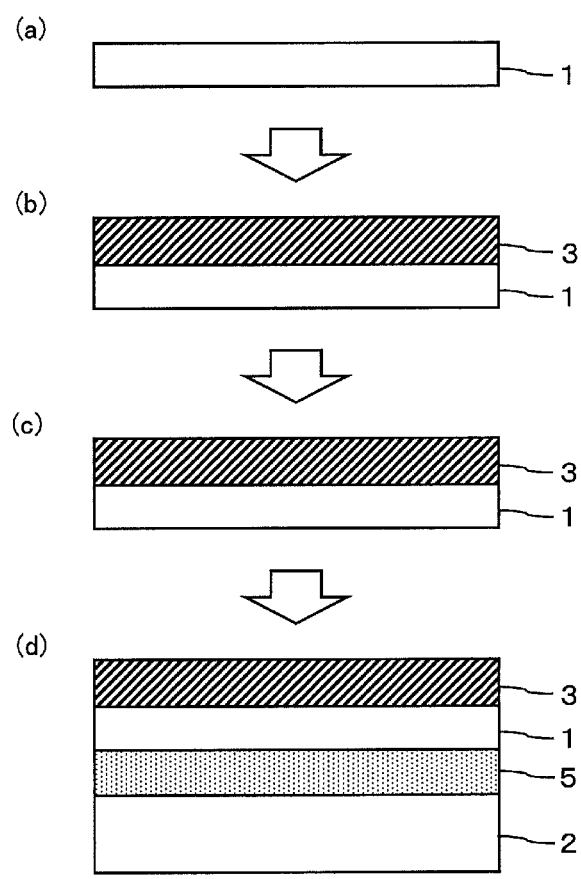
FIG. 3C is a schematic sectional view conceptually showing one example of a manufacturing process of a transparent conductive film.

FIGS. 3A to C are schematic sectional views each conceptually showing a manufacturing process of the transparent conductive film 102. In FIGS. 3A to C, an undercoat layer and a back surface coating layer are not shown. Bonding of transparent substrate films 11 and 12 with the pressure-sensitive adhesive layer 5 interposed therebetween can be performed either before the ITO film is formed (FIG. 3A), or after the amorphous ITO film is formed and before it is heated to be crystallized (FIG. 3B), or after the amorphous ITO film is heated to be crystallized (FIG. 3C).

Generally, formation of the amorphous ITO film by a sputtering method is performed continuously by a roll-to-roll method, whereas for crystallization by heating of the ITO film, a film cut into a sheet is often subjected to a heating treatment in a batch process. Therefore, in a configuration in which bases are bonded before crystallization of the ITO film as shown in FIGS. 3A and 3B, bonding can be performed continuously by a roll-to-roll method.

In particular, when an amorphous ITO film 3a is formed on the first flexible transparent base 1 before bonding of bases as shown in FIG. 3B, the thickness of the base during sputter deposition is small as compared to a case where a plurality of transparent substrate films are bonded beforehand (FIG. 3A). Therefore, the winding diameter of a roll winding body is decreased, so that the length of a film that can be continuously formed by a winding-type sputtering device is increased, thus being preferable in terms of productivity.

As shown in FIG. 3A, when flexible transparent bases 1 and 2 are bonded before the ITO film is formed, the amorphous ITO film 3a is formed on a flexible transparent base formed by bonding a plurality of bases (FIG. 3A (c)), and is crystallized. Therefore, it is preferred that the thickness, dimensional change rate and the like of the base in which the bonded two (or two or more) flexible transparent bases are considered as one united body are made to fall within the range described above for the first embodiment.

As shown in FIG. 3B, when transparent substrate films 11 and 12 are bonded after the amorphous ITO film is formed and before it is heated to be crystallized, the first flexible transparent base heated during formation of the amorphous ITO film (FIG. 3B (b)) and the second flexible transparent base, which is not subjected to formation of the ITO film, are bonded (FIG. 3B (c)), and crystallization is performed (FIG. 3B (d)). In this case, it is preferred that the thickness, dimensional change rate and the like of the base in which the bonded flexible transparent bases are considered as one united body are made to fall within the range described above for the first embodiment as well.

In the manufacturing methods in FIGS. 3A and 3B, the ITO film is crystallized in a heat treatment step after two or more flexible transparent bases are bonded. At this time, it is preferred that a compressive stress is given to the ITO film as the base is heat-shrunk as described above for the first embodiment, and at the same time, it is preferred that the dimensional changes for each single one of the flexible transparent bases are substantially equal to one another. If the dimensional changes of the flexible transparent bases are mutually different, failures may occur such that in the heat treatment step, bases are peeled from one another, or curl occurs in the transparent conductive film. From such a point of view, in each of the flexible transparent bases before being subjected to the heat treatment step, an absolute value of difference in dimensional change rate when heated at 150° C. for 1 hour is preferably 0.5% or less, more preferably 0.3% or less.

In particular, in the configuration shown in FIG. 3B, if the first flexible transparent base 1 is heated when subjected to formation of the ITO film, whereas the second flexible transparent base 2 is subjected to the heat treatment step without undergoing such heating, a difference in dimensional change in the heat treatment step may be increased because thermal histories of both the bases are largely different. For example, it is preferred that the second flexible transparent base 2 before being bonded to the first flexible transparent base 1 is heat-treated beforehand to ensure dimensional stability from the viewpoint of decreasing a difference in dimensional change rate between flexible transparent bases 1 and 2. Heating conditions for dimensional stability are appropriately set so as to decrease a difference in dimensional change rate, but preferably heating is carried out, for example, at about 130° C. to 160° C. for about 0.5 minutes to 3 minutes.

As shown in FIG. 3C, when transparent substrate films 11 and 12 are bonded after the ITO film is heated to be crystallized, the crystalline ITO film 3 is formed on the flexible transparent base 1 including one transparent substrate film as in the first embodiment (FIG. 3(c)), and the second transparent substrate film 12 is bonded thereto with the pressure-sensitive adhesive layer 5 interposed therebetween (FIG. 3C (d)).

The transparent conductive film of the present invention described above is suitably used for formation of transparent electrodes of various kinds of devices, and touch panels. In particular, the transparent conductive film of the present invention is suitable for resistive film type touch panels, and is suitably used particularly for touch panels of game machines and flexible displays because the transparent conductive layer is excellent in dotting property under a heavy load and bending resistance.

EXAMPLES

The present invention will be described below by showing Examples, but the present invention is not limited to Examples described below.
[Evaluation Methods]
Evaluations in Examples were performed in accordance with the following methods.

<Resistance and Surface Resistance>
The resistance value was measured by a two-terminal method. The surface resistance was measured by a four-probe method in accordance with JIS K7194 (1994).
<Dimensional Change Rate>
On the ITO film surface of a laminated body having an amorphous ITO film formed on a base, two gauge marks (scratches) were formed at an interval of about 80 mm in a conveyance direction (hereinafter, referred to as a "MD direction") during sputter deposition, and a distance $L_0$ between gauge marks before crystallization by heating and a distance $L_1$ between gauge marks after heating were measured by a two-dimensional length measuring machine to determine a dimensional change rate (%).
<Compressive Residual Stress of ITO Film>
The residual stress was determined indirectly from a crystal lattice strain of the ITO film by an X-ray scattering method.

Diffracted intensities were measured at intervals of 0.04° within a range of measurement scattering angle 2θ=59 to 62° by a powder X-ray diffractometer manufactured by Rigaku Corporation. The integral time (exposure time) at each measurement angle was 100 seconds.

A lattice plane spacing d of the ITO film was calculated from a peak (peak of the (622) plane of ITO) angle 2θ of the obtained diffraction image and a wavelength λ of an X-ray source, and a lattice strain ∈ was calculated on the basis of d. For calculation, the following equations (1) and (2) were used.

[Mathematical Formula 1]

$$2d \sin \theta = \lambda \quad (1)$$

$$\in = (d - d_0)/d_0 \quad (2)$$

Here, λ is a wavelength (=0.15418 nm) of the X-ray source (Cu Kα ray), and $d_0$ is a lattice plane spacing (=0.15241 nm) of ITO in a stress-free state. $d_0$ is a value acquired from the ICDD (The International Centre for Diffraction Data) database.

Figure 4:
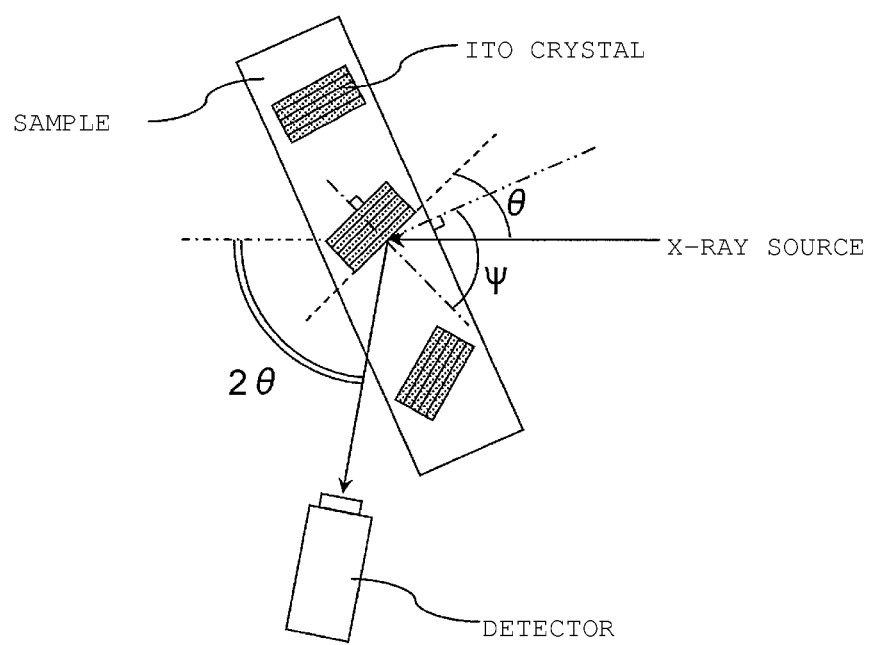
FIG. 4 is a view for illustrating angles θ and Ψ in measurement by an X-ray scattering method.

The X-ray diffraction measurement described above was performed for each of angles Ψ of 45°, 50°, 55°, 60°, 65°, 70°, 77° and 90° formed by a film plane-normal and an ITO crystal plane-normal as shown in FIG. 4, and a lattice strain E at each angle Ψ was calculated. The angle Ψ formed by the film plane-normal and ITO crystal plane-normal was adjusted by rotating a sample with a TD direction (direction orthogonal to the MD direction) as a rotation axis center. A residual stress σ in the ITO film in-plane direction was determined by the following equation (3) from the slope of a line obtained by plotting a relationship between $\sin^2 \Psi$ and the lattice strain ∈.

[Mathematical Formula 2]

$$\varepsilon = \frac{1+\nu}{E} \sigma \sin^2 \Psi - \frac{2\nu}{E} \sigma \quad (3)$$

In the above equation, E is a Young's modulus (116 GPa) of ITO and ν is a Poisson's ratio (0.35). These values are known measured values described in D. G. Neerinckand T. J. Vink, "Depth profiling of thin ITO films by grazing incidence X-ray diffraction", Thin Solid Films, 278 (1996), PP 12-17.
<Heavy Load Pen Dotting Durability>
(Preparation of Touch Panel)
A transparent conductive film was cut into a rectangle of 60 mm×140 mm with the long side in the MD direction. A silver paste was screen-printed in a width of 5 mm on both short sides of the rectangle, and dried at room temperature for 24 hours to form a silver electrode. The transparent conductive film on which the silver electrode was formed and an ITO electroconductive glass (manufactured by Nippon Soda Co., Ltd.) in which an ITO film 22 having a surface roughness of Ra=0.9 nm was formed on a glass 21 were arranged so that ITO forming surfaces faced each other with a spacer having a thickness of 180 μm interposed therebetween to prepare a touch panel schematically shown in FIG. 5.

(Heavy Load Pen Dotting Test)

A pen made of polyacetal (pen point R=0.8 mm) under a load of 1.5 kg was made to free-fall from the height of 2 cm above the upper electrode (transparent conductive film) side of the prepared touch panel. This operation was repeated at total 10 points along a line at interval of 1 mm. Employing this 10-point falling test as one set, the linearity was measured after one set of test and after five sets of tests.

(Measurement of Linearity)

A voltage of 5 V was applied between silver electrodes formed on short sides of the transparent conductive film, and an output voltage between one electrode (terminal A) and the other electrode (terminal B) was measured. The linearity is determined from the following calculation where the output voltage at a measurement start position A is $E_A$, the output voltage at a measurement end position B is $E_B$, the distance between A and B is $L_{AB}$, the output voltage at a measurement point at a distance X from the start position A is $E_X$, and the theoretical value is $E_{XX}$.

$$E_{XX} = \{X \cdot (E_B - E_A)/L_{AB}\} + E_A$$

$$\text{Linearity (\%)} = [(E_{XX} - E_X)/(E_B - E_A)] \times 100$$

Figure 6:
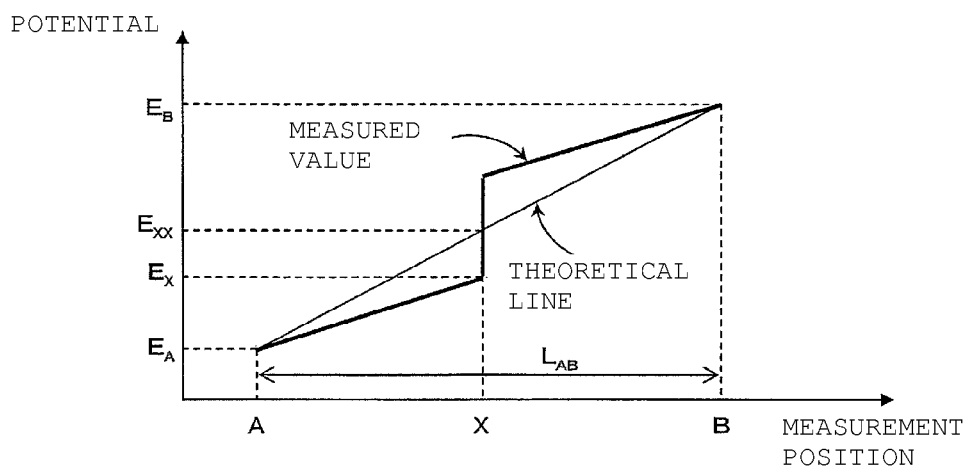
FIG. 6 is an explanatory view showing an outline of linearity measurement.

The outline of measurement of the linearity is as shown in FIG. 6. In an image display device using a touch panel, the position of a pen displayed on a screen is determined from a resistance value at a contact part between an upper panel and a lower panel by pressing the touch panel with the pen. The resistance value is determined on the assumption that the output voltage distribution on the surfaces of upper and lower panels is like a theoretical line (ideal line), but if the voltage value deviates from the theoretical line like a measured value in the figure, an actual pen position and a pen position on the screen, which is determined by the resistance value, do not adequately conform to each other. The deviation from the theoretical line is the linearity, and the deviation of the actual pen position from the pen position on the screen becomes larger as the value of linearity increases. This means that the less the linearity after the endurance test is, the more excellent durability is.

<Pen Sliding Endurance Test>
(Preparation of Touch Panel)

Figure 5:
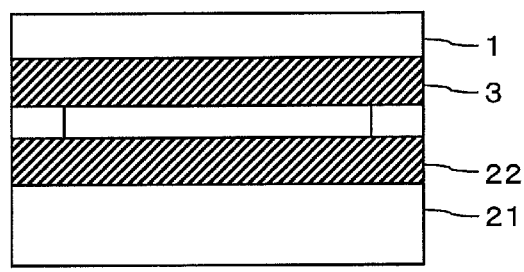
FIG. 5 is a schematic sectional view showing a configuration of a touch panel prepared for evaluation.

A touch panel schematically shown in FIG. 5 was formed in the same manner as in the heavy load pen dotting durability described above except that the thickness of the spacer was changed from 180 μm to 100 μm.

(Pen Sliding Test)

A pen made of polyacetal (pen point R=0.8 mm) was slid 50000 times (25000 reciprocations) under a load of 250 g from the upper electrode (transparent conductive film) side of the prepared touch panel. For a sample for which sliding was performed at a position at a distance of 1.66 mm from the touch panel end (silver electrode) and a sample for which sliding was performed at a position at a distance of 1.39 mm from the touch panel end, the linearity was measured respectively in the same manner as in the heavy load pen dotting durability described above.

<Bending Resistance>
(Preparation of Test Piece)

A transparent conductive film was cut into a rectangle of 10 mm×150 mm with the long side in the MD direction, a silver paste was screen-printed in a width of 5 mm on both short sides of the rectangle, and dried at room temperature for 24 hours to form a silver electrode. The resistance (initial resistance: $R_0$) of this test piece was determined by a two-terminal method.

(Tensile Flexibility)

The test piece was curved in conformity with a cork borer having a perforation diameter of 17 mmϕ with the ITO forming surface on the outer side, and held under a load of 1.0 kg for 10 seconds. Thereafter, the test piece was likewise curved and held under a load of 1.0 kg for 10 seconds using cork borers having perforation diameters of 15.5 mmϕ, 14 mmϕ, 12.5 mmϕ and 11 mmϕ one by one, a resistance $R_{11T}$ was then measured, and a change rate to initial resistance ($R_{11T}/R_o$) was determined. Thereafter, further the test piece was curved in conformity with a cork borer having a perforation diameter of 9.5 mmϕ, and held under a load of 1.0 kg for 10 seconds, a resistance $R_{9.5T}$ was then measured, and a change rate to initial resistance ($R_{9.5T}/R_o$) was determined.

(Compressive Flexibility)

In the same manner as the tensile flexibility test above described except that a test piece was curved in conformity with a cork borer with the ITO forming surface on the inner side, a resistance $R_{11C}$ after curving a test piece in conformity with cork borers having perforation diameters of 17 mmϕ, 15.5 mmϕ, 14 mmϕ, 12.5 mmϕ and 11 mmϕ and a resistance $R_{9.5C}$ after further curving the test piece in conformity with a cork borer having a perforation diameter of 9.5 mmϕ were measured, and change rates to initial resistance $R_{11C}/R_o$ and $R_{9.5C}/R_o$ were determined.

<Humidification Heat Reliability>

A transparent conductive film was placed in a thermohygrostat at 60° C. and a humidity of 95% for 500 hours, and the surface resistance was measured by a four-probe method to evaluate a resistance variation under humidification heat. The resistance variation under humidification heat is expressed as a ratio ($R/R_1$) of a surface resistance R after humidification heat to an initial surface resistance $R_1$.

Example 1

In Example 1, an amorphous ITO film was formed on a PET film (first flexible transparent base) having a thickness of 25 μm, on which two undercoat layers were formed, followed by bonding thereto a PET film (second flexible transparent base) having a thickness of 125 μm, on which a hard coat layer having a thickness of 5 μm was formed as a back surface coating layer, with a pressure-sensitive adhesive layer having a thickness of 25 μm interposed therebetween. Thereafter, the ITO film was heated to be crystallized to prepare a transparent conductive film in which a crystalline transparent conductive layer having a thickness of 20 nm was formed on a base having a total thickness of 180 μm. These steps are similar to those shown in FIG. 3B, and details of each step are as described below.

(Formation of Undercoat Layer)

A biaxial oriented polyethylene terephthalate film having a thickness of 25 μm (product name "Diafoil" manufactured by Mitsubishi Chemical Polyester Co., Ltd.; glass transition temperature: 80° C.; refractive index: 1.66; dimensional change rate in the MD direction after heating at 150° C. for 1 hour: −0.80%) was provided as a first transparent substrate, and two undercoat layers were formed on this PET film.

First, a thermosetting resin composition containing a melamine resin, an alkyd resin and an organic silane condensate at a weight ratio of 2:2:1 in terms of a solid content was diluted with methyl ethyl ketone so as to have a solid concentration of 8% by weight. This solution was applied to one main surface of the PET film, and heated at 150° C. for 2 minutes and thereby cured to form a first undercoat layer having a thickness of 150 nm and a refractive index of 1.54. Then, a siloxane-based thermosetting resin (product name "COLCOAT P" manufactured by COLCOAT CO., Ltd.) was diluted with methyl ethyl ketone so as to have a solid concentration of 1% by weight, and the solution was applied onto the first undercoat layer, and heated at 150° C. for 1 minute and thereby cured to form a $SiO_2$ thin film (second undercoat layer) having a thickness of 30 nm and a refractive index of 1.45. Even after formation of the undercoat layer, the dimensional change rate in the MD direction of the base after heating at 150° C. for 1 hour was −0.80%, and was not changed from the dimensional change rate before formation of the undercoat layer.

(Formation of Amorphous ITO Film)

A sintered body containing indium oxide and tin oxide at a weight ratio of 97:3 was attached as a target material to a parallel-plate type winding-type magnetron sputtering device. The PET film base on which two undercoat layers were formed was dehydrated and degassed while it was conveyed, and the device was evacuated to $5\times10^{-3}$ Pa. In this state, the temperature for heating the base was kept at 120° C., an argon gas and an oxygen gas were introduced at a flow ratio of 98%:2% so that the pressure was $4\times10^{-1}$ Pa, and film formation was carried out by a DC sputtering method to form an amorphous ITO film having a thickness of 20 nm on the base. The laminated body after formation of the amorphous ITO film was cooled at room temperature to release a residual stress, and a dimensional change rate in the MD direction after heating at 150° C. for 1 hour was then measured to find that the dimensional change rate was −0.45%.

(Preparation of PET Film with Hard Coat Layer)

A biaxial oriented polyethylene terephthalate film having a thickness of 125 μm (product name "Lumirror U43 125 μm" manufactured by Toray Industries, Inc.) was provided as a second transparent substrate film, and a hard coat layer was formed by a roll-to-roll method in the manner described below.

To 100 parts by weight of an acryl/urethane-based resin (product name "UNIDIC 17-806" manufactured by DIC Corporation) were added 5 parts by weight of hydroxycyclohexyl phenyl ketone (product name "IRGACURE 184" manufactured by Nihon Ciba-Geigy K.K.) as a photopolymerization initiator, and the mixture was diluted with toluene to prepare a hard coat coating solution having a solid content of 50% by weight. This solution was applied onto the second transparent substrate film, heated at 100° C. for 3 minutes and dried, and then irradiated with an ultraviolet ray in an integral light amount of 300 mJ/cm² by a high-pressure mercury lamp to form a hard coat layer having a thickness of 5 μm.

A PET film on which a hard coat layer was formed was heated in a heating furnace at 150° C. for 1 minute to ensure dimensional stability while it was conveyed by a roll conveyer. Thereafter, the PET film was cooled at room temperature to release a residual stress, and a dimensional change rate in the MD direction after heating at 150° C. for 1 hour was then measured to find that the dimensional change rate of the dimensional-stabilized PET film with a hard coat layer was −0.45%.

(Formation of Pressure-Sensitive Adhesive Layer)

In a polymerization tank equipped with a stirring mixer, a thermometer, a nitrogen gas inlet and a cooler, 100 parts by weight of butyl acrylate, 5 parts by weight of acrylic acid and 0.075 parts by weight of 2-hydroxyethyl acrylate, 0.2 parts by weight of 2,2'-azobis-isobutyronitrile as a polymerization initiator and 200 parts by weight of ethyl acetate as a polymerization solvent were placed, and sufficiently purged with nitrogen, and a polymerization reaction was then carried out for 10 hours with stirring under a nitrogen gas flow while the temperature in the polymerization tank was kept at around 55° C., so that an acryl-based polymer solution was prepared. Then, 0.2 parts by weight of dibenzoyl peroxide (product name "NYPER BMT" manufactured by NOF CORPORATION) as a peroxide, 0.5 parts by weight of an adduct body of trimethylolpropane/tolylenediisocyanate as an isocyanate-based crosslinker (product name "CORONATE L" manufactured by Nippon Polyurethane Industry Co., Ltd.) and 0.075 parts by weight of a silane coupling agent (product name "KBM 403" manufactured by Shin-Etsu Chemical Co., Ltd.) were uniformly mixed and stirred with 100 parts by weight of the solid content of the acryl-based polymer solution to prepare a pressure-sensitive adhesive solution (solid content: 10.9% by weight).

The acryl-based pressure-sensitive adhesive solution was applied onto the surface of the dimensional-stabilized PET film with a hard coat layer on which the hard coat layer was not formed, and heated and cured at 155° C. for 1 minute to form a pressure-sensitive adhesive layer having a thickness of 25 μm. Then, a separator provided with a silicone layer was bonded to the pressure-sensitive adhesive layer surface by roll bonding. The dimensional change rate in the MD direction of the hard coat PET film with a pressure-sensitive adhesive layer after heating at 150° C. for 1 hour was −0.45%.

(Bonding of Base)

The surface of the PET film provided with an ITO film on which the ITO film was not formed was continuously bonded to the exposed surface of the hard coat PET film with a pressure-sensitive adhesive layer by roll bonding while the separator was peeled off from the hard coat PET film. The obtained laminated body was such that an amorphous ITO film having a thickness of 20 nm was formed on a flexible transparent base having a total thickness of 180 μm.

(Crystallization of ITO Film)

A sheet of 300 mm square was cut out from the laminated body, and heated for 1 hour in a heating tank at 200° C. to crystallize the ITO film, so that a transparent conductive film having a crystalline ITO film was obtained.

Examples 2 to 6 and Comparative Examples 1 and 2

In Examples 2 to 6 and Comparative examples 1 and 2, transparent conductive films having a crystalline ITO film were prepared in the same manner as in Example 1 described above except that heating conditions in crystallization of the ITO film were changed as shown in Table 1.

Example 7

In Example 7, a transparent conductive film was prepared in the same manner as in Example 1, but unlike Example 1, the conveyance tensions were increased when the amorphous ITO film was sputter deposited and when the PET film with a hard coat layer was dimensional-stabilized, and the heating temperature in the heat treatment step was 150° C.

Specifically, the conveyance tension during sputter deposition was set to double the conveyance tension in Example 1, and the amorphous ITO film was formed under a situation in which the PET film was stretched. The laminated body after formation of the amorphous ITO film was cooled at room temperature to release a residual stress, and a dimensional change rate in the MD direction after heating at 150° C. for 1 hour was then measured to find that the dimensional change rate was −0.85%.

Further, the conveyance tension when the PET film with a hard coat layer was dimensional-stabilized by heating the PET film in a heating furnace while conveying it by a roll conveyer was set to 8 times as high as the conveyance tension in Example 1. After the PET film was dimensional-stabilized, it was cooled at room temperature to release a residual stress, and a dimensional change rate in the MD direction after heating at 150° C. for 1 hour was then measured to find that the dimensional change rate of the dimensional-stabilized PET film with a hard coat layer was −0.85%.

Example 8

In Example 8, an amorphous ITO film was formed on the under coat layer forming surface of a PET film having a total thickness of 180 μm, in which two under coat layers were formed on one surface and a hard coat layer having a thickness of 5 μm was formed on the other surface, and then heated to be crystallized, thereby preparing a transparent conductive film in which a crystalline transparent conductive layer having a thickness of 20 nm was formed on the base having a total thickness of 180 μm.

(Formation of Undercoat Layer and Hard Coat Layer)

Two undercoat layers were formed, in the same manner as in Example 1, on one surface of a biaxial oriented polyethylene terephthalate film having a thickness of 175 μm (product name "Lumirror U43 175 μm" manufactured by Toray Industries, Inc; glass transition temperature: 80° C.; refractive index: 1.66; dimensional change rate in the MD direction after heating at 150° C. for 1 hour: −0.9%). Thereafter, a hard coat layer having a thickness of 5 μm was formed on the other surface of the PET film in the same manner as in Example 1. The base after formation of the undercoat layer and the hard coat layer had a dimensional change rate in the MD direction of −0.65% after heating at 150° C. for 1 hour.

An amorphous ITO film having a thickness of 20 nm was formed on the undercoat layer forming surface of the base by a sputtering method in the same manner as in Example 1. The laminated body after formation of the amorphous ITO film was cooled at room temperature to release a residual stress, and thereafter a sheet of 300 mm square was cut out from the laminated body, and heated for 1 hour in a heating tank at 150° C. to crystallize the ITO film, so that a transparent conductive film having a crystalline ITO film was obtained. The laminated body after formation of the ITO film and before crystallization of the ITO film had a dimensional change rate in the MD direction of −0.59% after heating at 150° C. for 1 hour.

Example 9

In Example 9, an amorphous ITO film was formed on a PET film (first flexible transparent base) having a thickness of 25 μm, on which two undercoat layers were formed, and the ITO film was heated to be crystallized followed by bonding thereto a PET film (second flexible transparent base) having a thickness of 125 μm on which a hard coat layer having a thickness of 5 μm was formed, with a pressure-sensitive adhesive layer having a thickness of 25 μm interposed therebetween. These steps are similar to those shown in FIG. 3C.

Specifically, in the same manner as in example 1, the amorphous ITO film was formed on the first flexible transparent base, and the pressure-sensitive adhesive layer was formed on the second flexible transparent base on which the hard coat layer was formed. Without bonding the first flexible transparent base and the second flexible transparent base, the laminated body in which the amorphous ITO film was formed on the first flexible transparent base was cut into a sheet of 300 mm square, and heated for 1 hour in a heating tank at 180° C. to crystallize the ITO film. Thereafter, the first flexible transparent base on which the crystalline ITO film was formed was bonded to the second flexible transparent base with a pressure-sensitive adhesive layer, which was cut into a sheet of 300 mm square, so that a transparent conductive film having a total thickness of 180 μm was obtained.

Example 10

In Example 10, a transparent conductive film with a crystalline ITO film having a total thickness of 180 μm was prepared in the same manner as in Example 9 described above except that the heating temperature in crystallization of the ITO film was changed to 150° C.

Conditions and results of evaluation of transparent conductive films for Examples and Comparative Examples are shown respectively in Table 1. The thickness of the base in Table 1 represents the thickness in the crystallization step. The total thickness of the transparent conductive film of each of Examples and Comparative examples used for evaluations was 180 μm.

TABLE 1

| | Manufacturing conditions | | | | | Evaluation results | | |
|---|---|---|---|---|---|---|---|---|
| | Base | | Crystallization conditions | | | | | Humidification heat reliability |
| | Thickness μm | Dimensional change rate (150° C. × 1 h) % | Temperature ° C. | Time h | Dimensional change % | Surface resistance Ω/□ | Residual compressive stress GPa | (change in resistance) R/R$_1$ |
| Example 1 | 180 | −0.45 | 200 | 1 | −1.10 | 300 | 1.79 | 1.47 |
| Example 2 | 180 | −0.45 | 190 | 1 | −0.98 | 300 | 1.50 | 1.28 |
| Example 3 | 180 | −0.45 | 180 | 1 | −0.84 | 300 | 1.22 | 0.99 |
| Example 4 | 180 | −0.45 | 170 | 1 | −0.78 | 300 | 1.03 | — |
| Example 5 | 180 | −0.45 | 160 | 1 | −0.65 | 300 | 0.86 | — |
| Example 6 | 180 | −0.45 | 150 | 1 | −0.37 | 300 | 0.57 | 1.05 |
| Example 7 | 180 | −0.85 | 150 | 1 | −0.85 | 300 | 0.61 | — |

TABLE 1-continued

| | | | | | | | | |
|---|---|---|---|---|---|---|---|---|
| Example 8 | 180 | −0.65 | 150 | 1 | −0.59 | 300 | 0.72 | — |
| Example 9 | 25 | −0.45 | 180 | 1 | −0.85 | 300 | 1.27 | — |
| Example 10 | 25 | −0.45 | 150 | 1 | −0.43 | 300 | 0.51 | — |
| Comparative Example 1 | 180 | −0.45 | 80 | 170 | −0.10 | 300 | 0.21 | — |
| Comparative Example 2 | 180 | −0.45 | 120 | 3 | −0.22 | 300 | 0.30 | 1.05 |

| | Evaluation results | | | | | | | |
|---|---|---|---|---|---|---|---|---|
| | Bending resistance (change in resistance) | | | | Pen dotting durability (linearity) | | Pen sliding durability (linearity) | |
| | Tensile | | Compressive | | One set | Five Sets | 1.66 mm | 1.39 mm |
| | $R_{11T}/R_0$ | $R_{9.5T}/R_0$ | $R_{11C}/R_0$ | $R_{9.5C}/R_0$ | % | % | % | % |
| Example 1 | 1.0 | 1.0 | 1.0 | 1.2 | 0.4 | 0.8 | 0.6 | 0.4 |
| Example 2 | 1.0 | 1.0 | 1.0 | 1.0 | 0.9 | 1.0 | 0.7 | 0.3 |
| Example 3 | 1.0 | 1.0 | 1.0 | 1.0 | 1.0 | 0.8 | 0.6 | 0.7 |
| Example 4 | 1.1 | 1.8 | 1.0 | 1.0 | 1.4 | 1.2 | 0.9 | 1.2 |
| Example 5 | 1.1 | 5.9 | 1.0 | 1.0 | 2.1 | 16.8 | 1.8 | 9.5 |
| Example 6 | 1.6 | 4.2 | 1.0 | 1.0 | 1.6 | 14.5 | 1.0 | 11.1 |
| Example 7 | 1.6 | 3.8 | 1.0 | 1.0 | 1.8 | 14.0 | 1.0 | 14.5 |
| Example 8 | 1.1 | 6.6 | 1.0 | 1.0 | 0.6 | 1.5 | 1.0 | — |
| Example 9 | 1.0 | 1.0 | 1.0 | 1.0 | 0.2 | 0.9 | 0.9 | 1.4 |
| Example 10 | 1.1 | 4.6 | 1.0 | 1.0 | 2.3 | 14.5 | 1.3 | 15.5 |
| Comparative Example 1 | 50.0 | 114.3 | 4.0 | 5.1 | 10.1 | 14.5 | 44.5 | 41.9 |
| Comparative Example 2 | 20.2 | 51.6 | 1.7 | 3.2 | 6.1 | 14.3 | 49.0 | 30.1 |

As is evident from Table 1, the transparent conductive films of Examples with the ITO film having a predetermined residual compressive stress are excellent in bending resistance and heavy load dotting property as compared to the transparent conductive films of Comparative examples. On the other hand, a change in resistance due to humidification heat tends to increase as the residual compressive stress of the ITO film becomes larger. Therefore, it follows that the residual compressive stress of the ITO film is preferably set in an appropriate range in consideration of balance among bending resistance, heavy load dotting property and humidification heat reliability.

When a comparison is made between Examples 3 and 4 and Examples 8 and 9 which are different in thickness of the base during crystallization, it is apparent that, regardless of the thickness of the base, by elevating the temperature in the heat treatment step, the crystallization shrinkage coefficient is increased (=dimensional change is negative, and its absolute value becomes larger), and the residual compressive stress of the crystalline ITO film is increased, so that a transparent conductive film excellent in bending resistance and heavy load dotting property is obtained.

In the tensile bending test, an abrupt change in resistance may occur when the bending curvature is increased, but in Examples 1 to 4 and 9, $R_{9.5T}/R_0$ is kept at 2 or less. In these Examples, even when sliding is performed at a position of 1.39 mm from the screen edge in the pen sliding durability test, the linearity is not significantly increased as compared to a case where sliding is performed at a position of 1.66 mm from the screen edge, and therefore it is apparent that the transparent conductive film is excellent particularly in bending resistance.

It is considered that in Example 7, a high compressive stress is given to the ITO film in an amorphous state as compared to Example 6 because a high stress is given in the MD direction of the base during sputter deposition of the amorphous ITO film, and the stress is released after film formation. However, the residual compressive stresses of the crystalline ITO films in the transparent conductive films of Examples 6 and 7 are substantially equal, and their levels of durability are also substantially equal. From this result, it can be said that for improving the durability of the ITO film, it is important to, rather than giving a compressive stress to the ITO film in an amorphous state, give a compressive stress when the ITO film is subsequently heated to be crystallized.

<Crystal Grain Size Distribution of ITO Film>

A quadrate test piece of 300 μm×300 μm was cut out from the transparent conductive film of each of Examples 3 and 6, and fixed in a sample holder of an ultra-microtome with the ITO film surface situated at the front. Then, a microtome knife was placed at an extremely sharp angle with respect to the ITO film surface, and the film was cut in a set thickness of 70 nm so that the cut surface was substantially parallel to the ITO film surface, thus obtaining an observation sample. An observation field of 1.5 μm×1.5 μm was selected from an area of the observation sample, which was situated on the ITO film surface side and was not significantly damaged, and observed at an acceleration voltage of 100 kV using a transmission electron microscope (model "H-7650" manufactured by Hitachi, Ltd.). Maximum grain sizes of all crystal grains observed in the visual field of 1.5 μm square were determined from an observation photograph (magnification: 50000), and area ratios of crystals having a maximum grain size of 30 to 100 nm, of more than 100 nm and 200 nm or less, and of more than 200 nm and 300 nm or less, were determined. Area ratios (%) are shown in Table 2.

TABLE 2

| | Maximum grain size (nm) | | | |
|---|---|---|---|---|
| | 30 to 100 | More than 100 and 200 or less | More than 200 and 300 or less | More than 300 |
| Example 3 | 15 | 63 | 22 | 0 |
| Example 6 | 13 | 64 | 23 | 0 |

DESCRIPTION OF REFERENCE SIGNS 1, 2 flexible transparent base
3 transparent conductive layer (crystalline ITO film)
3a amorphous ITO film
5 pressure-sensitive adhesive layer
11, 12 transparent substrate film
16 undercoat layer
17 back surface coating layer
101 transparent conductive film
102 transparent conductive film

The invention claimed is:

1. A transparent conductive film, comprising
a flexible transparent base; and
a transparent conductive layer formed on the flexible transparent base and including a crystalline indium/tin composite oxide,
wherein a compressive residual stress of the transparent conductive layer is 0.7 to 2 GPa,
wherein the transparent conductive layer is formed by a sputtering method,
wherein the transparent conductive layer is crystallized by heating, and a dimensional change in at least one direction in a plane of the layer with respect to a dimension before crystallization is −0.3% to −1.5%,
the flexible transparent base comprises a transparent substrate film and an undercoat layer, and
the undercoat layer comprises an organic substance or a mixture of an inorganic substance and an organic substance.

2. The transparent conductive film according to claim 1, wherein the content of crystals having a maximum grain size of 300 nm or less is 95% by area or more.

3. The transparent conductive film according to claim 1, wherein the content of crystals having a maximum grain size of 200 nm or less is more than 50% by area.

4. The transparent conductive film according to claim 1, wherein the content of crystals having a maximum grain size of 100 nm or less is more than 5% by area, and the maximum grain size of remaining crystals falls within a distribution range of more than 100 nm and 200 nm or less.

5. The transparent conductive film according to claim 1, wherein the thickness of the transparent conductive layer is 10 to 100 nm.

* * * * *